(12) United States Patent
Banine et al.

(10) Patent No.: US 9,594,306 B2
(45) Date of Patent: Mar. 14, 2017

(54) LITHOGRAPHIC APPARATUS, SPECTRAL PURITY FILTER AND DEVICE MANUFACTURING METHOD

(75) Inventors: Vadim Yevgenyevich Banine, Deurne (NL); Wilhelmus Petrus De Boeij, Veldhoven (NL); Antonius Johannes Josephus Van Dijsseldonk Van Dijsseldonk, Hapert (NL); Erik Roelof Loopstra, Eindhoven (NL); Johannes Hubertus Josephina Moors, Helmond (NL); Jan Bernard Plechelmus Van Schoot, Eindhoven (NL); Gerardus Hubertus Petrus Maria Swinkels, Eindhoven (NL); Andrei Mikhailovich Yakunin, Mierlo (NL)

(73) Assignee: ASML Netherlands B.V., Veldhoven (NL)

( * ) Notice: Subject to any disclaimer, the term of this patent is extended or adjusted under 35 U.S.C. 154(b) by 316 days.

(21) Appl. No.: 14/002,000

(22) PCT Filed: Dec. 21, 2011

(86) PCT No.: PCT/EP2011/073537
§ 371 (c)(1),
(2), (4) Date: Nov. 6, 2013

(87) PCT Pub. No.: WO2012/119672
PCT Pub. Date: Sep. 13, 2012

(65) Prior Publication Data
US 2014/0085619 A1    Mar. 27, 2014

Related U.S. Application Data

(60) Provisional application No. 61/449,381, filed on Mar. 4, 2011.

(51) Int. Cl.
*G03F 7/20* (2006.01)
*B82Y 10/00* (2011.01)
(Continued)

(52) U.S. Cl.
CPC .......... *G03F 7/70191* (2013.01); *B82Y 10/00* (2013.01); *G03F 7/702* (2013.01);
(Continued)

(58) Field of Classification Search
CPC ............. G03F 7/70575; G03F 7/70191; G03F 7/70958; G03F 7/70941; G03F 7/70308; G03F 7/702
See application file for complete search history.

(56) References Cited

U.S. PATENT DOCUMENTS 6,469,827 B1 * 10/2002 Sweatt ................... G02B 27/30
355/71
7,453,645 B2    11/2008 Klunder et al.
(Continued)

FOREIGN PATENT DOCUMENTS

EP    1 717 609 A1    11/2006
JP    2006-235595 A    9/2006
(Continued)

OTHER PUBLICATIONS

Bibishkin, M.S., et al., "Multilayer Zr/Si filters for EUV lithography and for radiation source metrology," Proceedings of SPIE, Micro- and Nanoelectronics 2007, vol. 7025, May 2008; pp. 702502-1 to 702502-10.
(Continued)

*Primary Examiner* — Michelle M Iacoletti
(74) *Attorney, Agent, or Firm* — Sterne, Kessler, Goldstein & Fox P.L.L.C.

(57) ABSTRACT

A lithographic apparatus for patterning a beam of radiation and projecting it onto a substrate, comprising at least two
(Continued)

spectral purity filters configured to reduce the intensity of radiation in the beam of radiation in at least one undesirable range of radiation wavelength, wherein the two spectral purity filters are provided with different radiation filtering structures from each other.

17 Claims, 10 Drawing Sheets

(51) Int. Cl.
  *G21K 1/06* (2006.01)
  *H05G 2/00* (2006.01)

(52) U.S. Cl.
  CPC ...... *G03F 7/70008* (2013.01); *G03F 7/70308* (2013.01); *G03F 7/70575* (2013.01); *G21K 1/062* (2013.01); *G21K 1/067* (2013.01); *G21K 2201/061* (2013.01); *G21K 2201/067* (2013.01); *H05G 2/003* (2013.01)

(56) References Cited

U.S. PATENT DOCUMENTS

| | | |
|---|---|---|
| 2002/0097385 A1 | 7/2002 | Van Elp et al. |
| 2003/0058529 A1 | 3/2003 | Goldstein |
| 2005/0012928 A1 | 1/2005 | Sezginer et al. |
| 2005/0112510 A1 | 5/2005 | Bakker |
| 2005/0122589 A1 | 6/2005 | Bakker |
| 2006/0146413 A1 | 7/2006 | Klunder et al. |
| 2007/0170379 A1 | 7/2007 | Watson et al. |
| 2010/0321654 A1 | 12/2010 | Den Boef |
| 2011/0044425 A1* | 2/2011 | Jak ............... G02B 5/201 378/34 |

FOREIGN PATENT DOCUMENTS

| | | |
|---|---|---|
| JP | 2006-310793 A | 11/2006 |
| JP | 2008-130914 A | 6/2008 |
| JP | 2008-288299 A | 11/2008 |
| JP | 2010-004001 A | 1/2010 |
| JP | 2010-021550 A | 1/2010 |
| JP | 2010-087312 A | 4/2010 |
| WO | WO 2009/144117 A1 | 12/2009 |
| WO | WO 2009144117 A1 * | 12/2009 |
| WO | WO 2010/018039 A1 | 2/2010 |
| WO | WO 2010/022840 A1 | 3/2010 |
| WO | WO 2011/023454 A1 | 3/2011 |
| WO | WO 2011/032768 A2 | 3/2011 |

OTHER PUBLICATIONS

Eriksson, N., et al., "Highly Directional Grating Outcouplers with Tailorable Radiation Characteristics," IEEE Journal of Quantum Electronics, vol. 32, No. 6, Jun. 1996; pp. 1038-1047.

International Search Report directed to related International Patent Application No. PCT/EP2011/073537, mailed May 7, 2012; 4 pages.

International Preliminary Report on Patentability and Written Opinion of the International Searching Authority diresctsd to related International Patent Application No. PCT/EP2011/073537, mailed Sep. 10, 2013; 9 pages.

* cited by examiner

US 9,594,306 B2

LITHOGRAPHIC APPARATUS, SPECTRAL PURITY FILTER AND DEVICE MANUFACTURING METHOD

CROSS-REFERENCE TO RELATED APPLICATIONS

This application claims the benefit of U.S. provisional application 61/449,381, which was filed on 4 Mar. 2011, and which is incorporated herein in its entirety by reference.

BACKGROUND OF THE INVENTION

Field of the Invention

The present invention relates to a lithographic apparatus, a spectral purity filter and a device manufacturing method.

Background Art

A lithographic apparatus is a machine that applies a desired pattern onto a substrate, usually onto a target portion of the substrate. A lithographic apparatus can be used, for example, in the manufacture of integrated circuits (IC's). In that instance, a patterning device, which is alternatively referred to as a mask or a reticle, may be used to generate a circuit pattern be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA_{PS}} \quad (1)$$

where $\lambda$ is the wavelength of the radiation used, $NA_{PS}$ is the numerical aperture of the projection system used to print the pattern, $k_1$ is a process dependent adjustment factor, also called the Rayleigh constant, and CD is the feature size (or critical dimension) of the printed feature. It follows from equation (1) that, reduction of the minimum printable size of features can be obtained in three ways: by shortening the exposure wavelength $\lambda$, by increasing the numerical aperture $NA_{PS}$ or by decreasing the value of $k_1$.

In order to shorten the exposure wavelength and, thus, reduce the minimum printable size, it has been proposed to use an extreme ultraviolet (EUV) radiation source. EUV radiation sources are configured to output a radiation wavelength of about 13 nm. Thus, EUV radiation sources may constitute a significant step toward achieving small features printing. Such radiation is termed extreme ultraviolet or soft x-ray, and possible sources include, for example, laser-produced plasma sources, discharge plasma sources, or synchrotron radiation from electron storage rings. Along with useful EUV in-band radiation, EUV radiation sources may produce almost equal (and sometimes more) undesirable out-of-band infrared ("IR") and deep ultraviolet ("DUV") radiation.

Spectral purity filters have been developed to filter the non-EUV radiation out of the beam of radiation to be used for exposure.

EP 1 717 609 discloses a lithographic apparatus including multi-layer mirrors that may each be provided with a respective spectral purity enhancement layer.

BRIEF DESCRIPTION OF THE DRAWINGS/FIGURES

Embodiments of the invention will now be described, by way of example only, with reference to the accompanying schematic drawings in which corresponding reference symbols indicate corresponding parts, and in which.

Figure 10:
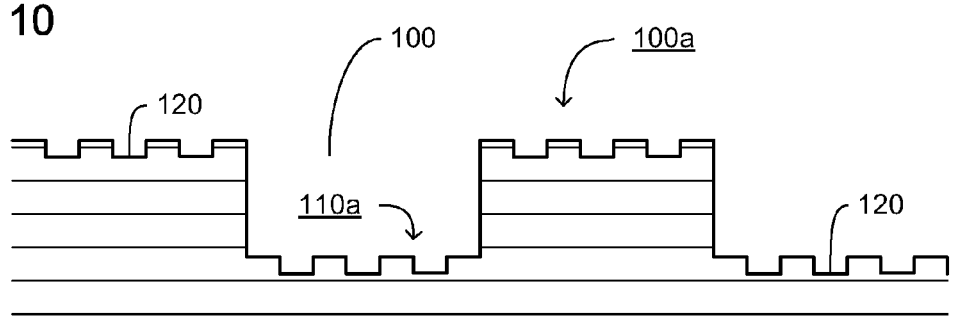
Figure 11:
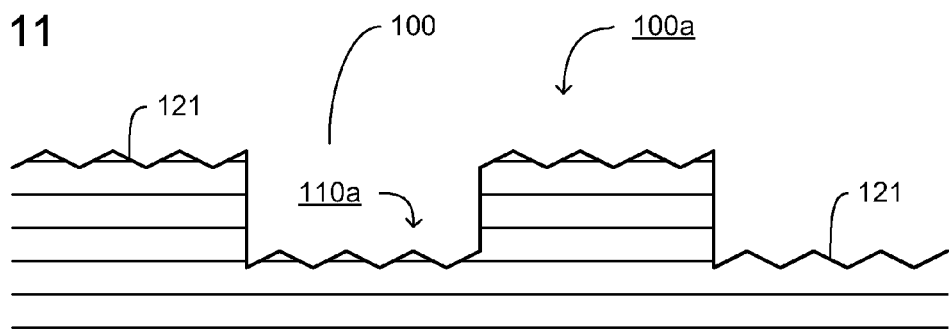
Figure 12:
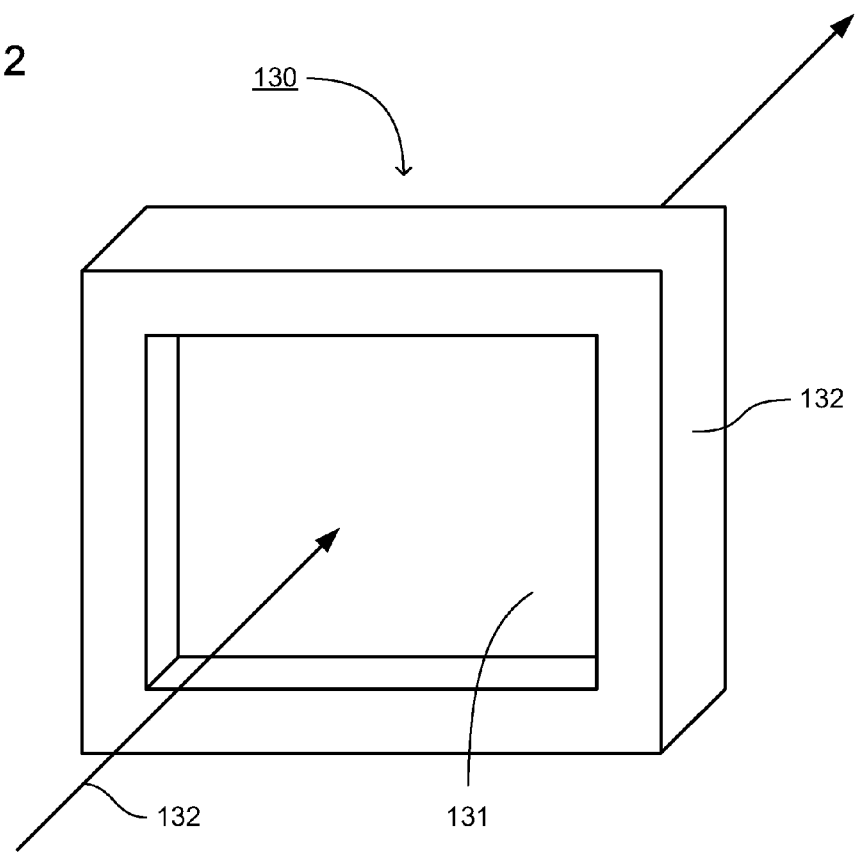
Figure 13:
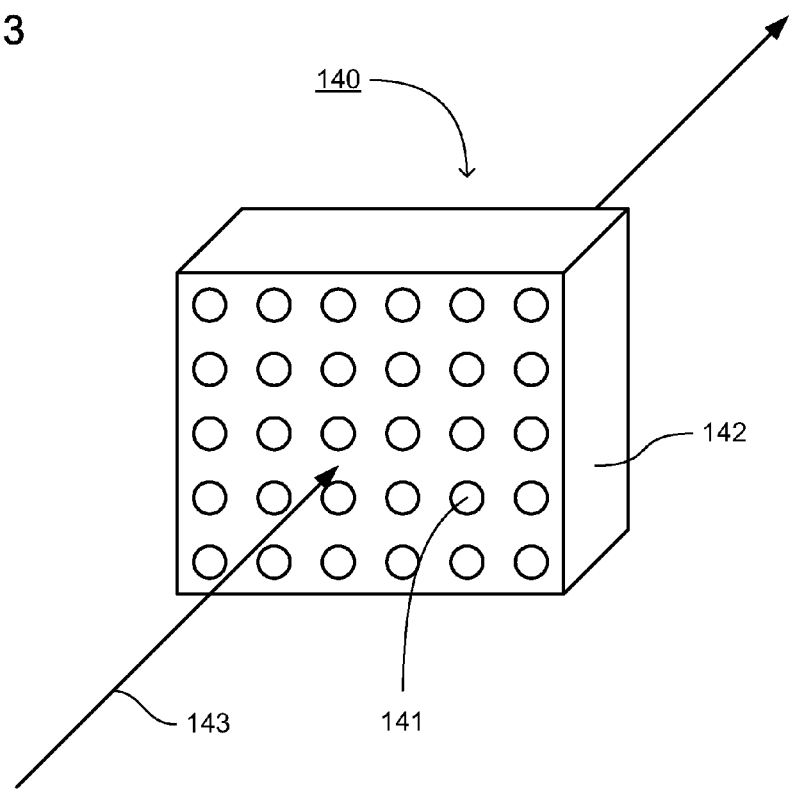
Figure 14:
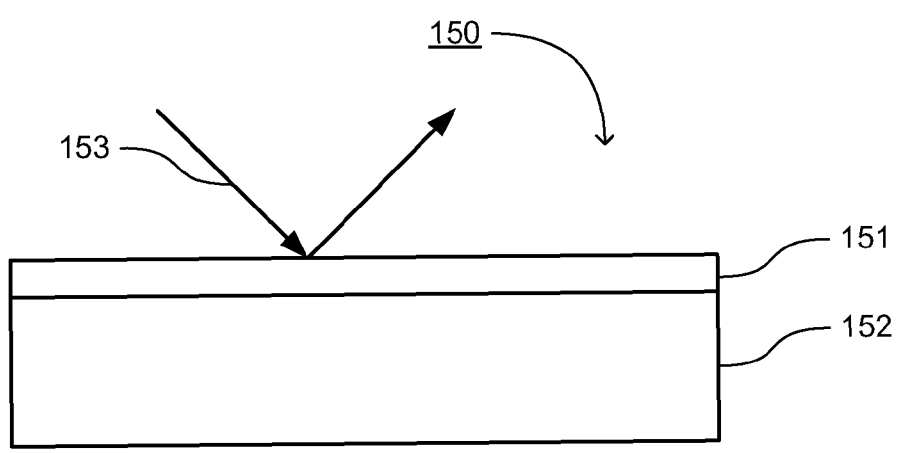

FIGS. 10 and 11 schematically depict an arrangement of a spectral purity filter that may be used in the present invention;

FIG. 12 depicts an arrangement of a spectral purity filter that may be used in the present invention;

FIG. 13 depicts an arrangement of a spectral purity filter that may be used in the present invention; and FIG. 14 depicts an arrangement of a spectral purity filter that may be used in the present invention.

Features and advantages of the present invention will become more apparent from the detailed description set forth below when taken in conjunction with the drawings, in which like reference characters identify corresponding elements throughout, in the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE INVENTION

Figure 1:
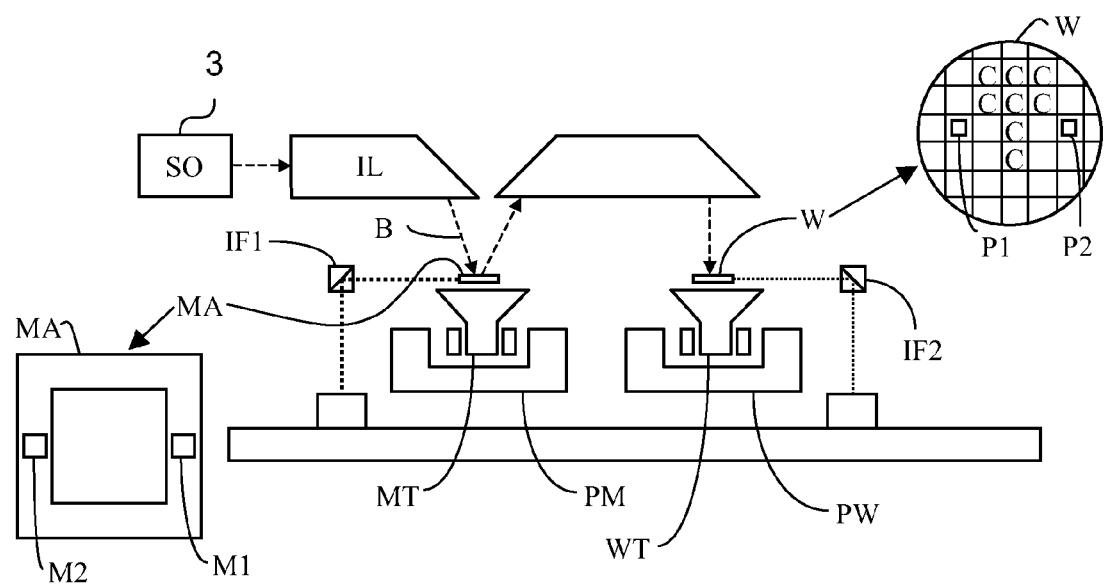
FIG. 1 depicts a lithographic apparatus in accordance with an embodiment of the invention.

FIG. 1 schematically depicts an embodiment of a lithographic apparatus, that can be or include an embodiment of the invention. The apparatus includes an illumination system (illuminator) IL configured to condition a radiation beam B (e.g., EUV radiation); a support structure or patterning device support (e.g., a mask table) MT constructed to support a patterning device (e.g., a mask or a reticle) MA and connected to a first positioner PM configured to accurately position the patterning device; a substrate table (e.g., a wafer table) WT constructed to hold a substrate (e.g., a resist-coated wafer) W and connected to a second positioner PW configured to accurately position the substrate; and a projection system (e.g., a reflective projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam that is reflected by the mirror matrix.

The term "projection system" may encompass any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. It may be desired to use a vacuum for EUV or electron beam radiation since other gases may absorb too much radiation or electrons. A vacuum environment may therefore be provided to the whole beam path with the aid of a vacuum wall and vacuum pumps.

As here depicted, the apparatus is of a reflective type (e.g., employing a reflective mask). Alternatively, the apparatus may be of a transmissive type (e.g., employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source SO may be part of a radiation system 3 (i.e., radiation generating unit 3). The radiation system 3 and the lithographic apparatus may be separate entities. In such cases, the radiation system 3 is not considered to form part of the lithographic apparatus and the radiation beam is passed from the source SO of radiation system 3 to the illuminator IL with the aid of a beam delivery system including, for example, suitable directing mirrors and/or a beam expander. In other cases, the source may be an integral part of the lithographic apparatus.

The source SO of the radiation system 3 may be configured in various ways. For example, the source SO may be a laser produced plasma source (LPP source), for example a Tin LPP source (such LPP sources are known per se) or a discharge-produced plasma source (DPP source). The source SO may also be a different type of radiation source.

The illuminator IL may include an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator and a condenser. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor IF2 (e.g., an interferometric device, linear encoder or capacitive sensor), the substrate table WT can be moved accurately, e.g., so as to position different target portions C in the path of the radiation beam B. Similarly, the first positioner PM and another position sensor IF1 can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

The depicted apparatus could be used in at least one of the following modes:

1. In step mode, the support structure (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.

2. In scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
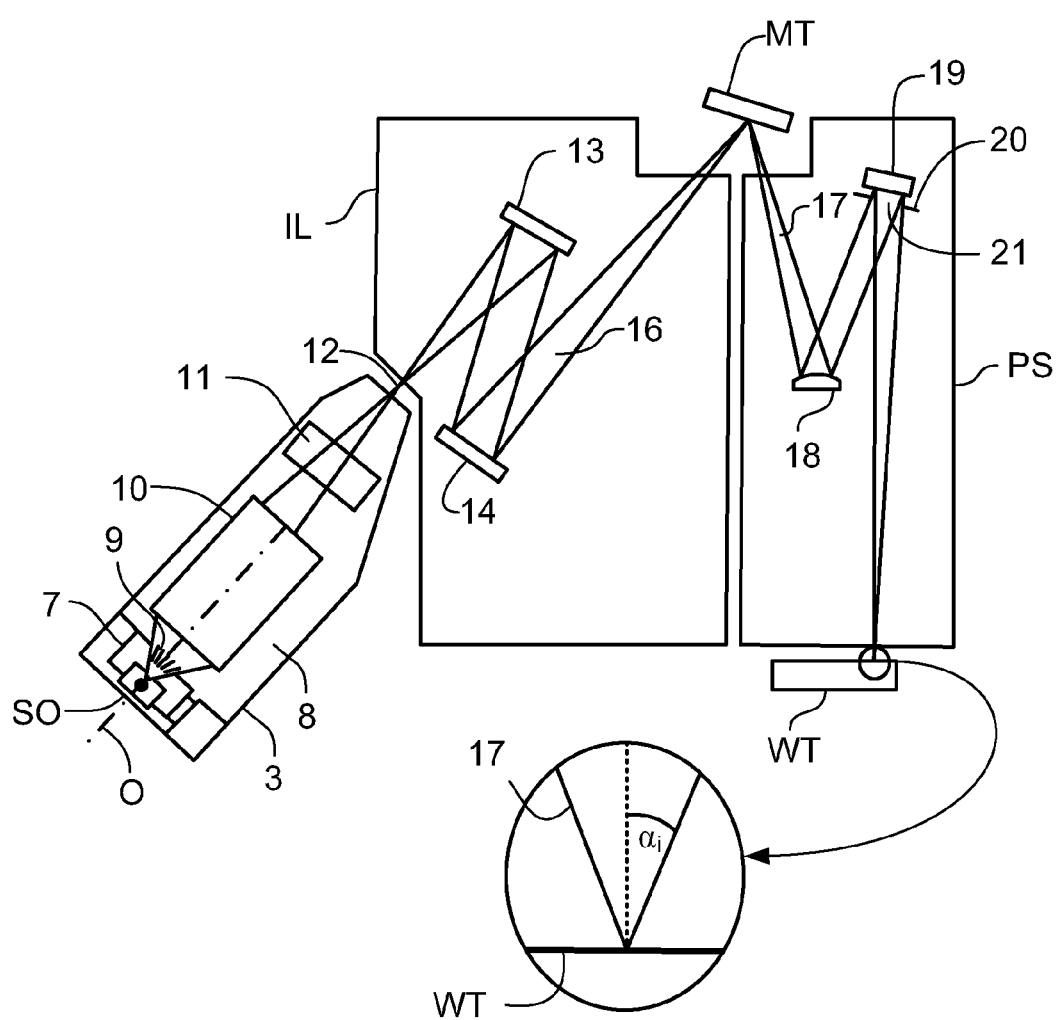
FIG. 2 depicts a lithographic apparatus in accordance with an embodiment of the invention.

FIG. 2 schematically shows a further embodiment of an EUV lithographic apparatus, having a principle of operation that is similar to the operation of the apparatus shown in the embodiment of FIG. 1. In the embodiment of FIG. 2, the apparatus includes a source-collector-module or radiation unit 3 (also referred to herein as a radiation system), an illumination system IL and a projection system PS. According to an embodiment, radiation unit 3 is provided with a radiation source SO, preferably a laser produced plasma ("LPP") source. In the present embodiment, the radiation emitted by radiation source SO may be passed from the source chamber 7 into a chamber 8 via, a gas barrier or "foil trap" 9. In FIG. 2, the chamber 8 includes a radiation collector 10.

FIG. 2 depicts the application of a grazing incidence collector 10. However, the collector may be a normal incidence collector, particularly in the case the source is a LPP source. In yet another embodiment, the collector may a Schwarzschild collector (see FIG. 4), and the source may be a DPP source.

The radiation may be focused in a virtual source point 12 (i.e., an intermediate focus IF) from an aperture in the chamber 8. From chamber 8, the radiation beam 16 is reflected in illumination system 11 via normal incidence reflectors 13,14 onto a patterning device (e.g., reticle or mask) positioned on support structure or patterning device support (e.g., reticle or mask table) MT. A patterned beam 17 is formed that is imaged by projection system PS via reflective elements 18,19 onto wafer stage or substrate table WT. More elements than shown may generally be present in the illumination system IL and projection system PS.

One of the reflective elements 19 may have in front of it a numerical aperture (NA) disc 20 having an aperture 21 therethrough. The size of the aperture 21 determines the angle $\alpha_i$ subtended by the patterned radiation beam 17 as it strikes the substrate table WT.

In other embodiments, the radiation collector is one or more of a collector configured to focus collected radiation into the radiation beam emission aperture; a collector having a first focal point that coincides with the source and a second focal point that coincides with the radiation beam emission aperture; a normal incidence collector; a collector having a single substantially ellipsoid radiation collecting surface section; and a Schwarzschild collector having two radiation collecting surfaces.

Also, in another embodiment, the radiation source SO may be a laser produced plasma (LPP) source including a light source that is configured to focus a beam of coherent light, of a predetermined wavelength, onto a fuel.

Figure 3:
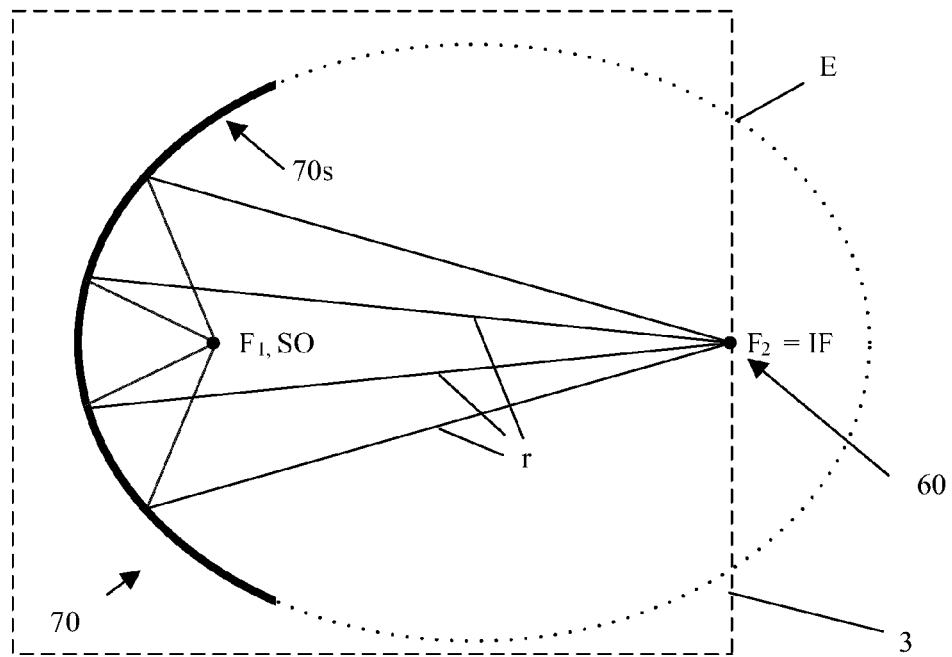
FIG. 3 depicts a radiation source and a normal incidence collector in accordance with an embodiment of the invention.

For example, FIG. 3 shows an embodiment of a radiation source unit 3, in cross-section, including a normal incidence collector 70. The collector 70 has an elliptical configuration, having two natural ellipse focus points F1, F2. Particularly, the normal incidence collector includes a collector having a single radiation collecting surface 70s having the geometry of the section of an ellipsoid. In other words: the ellipsoid radiation collecting surface section extends along a virtual ellipsoid (part of which is depicted by as dotted line E in the drawing).

As will be appreciated by the skilled person, in case the collector mirror 70 is ellipsoidal (i.e., including a reflection surface 70s that extends along an ellipsoid), it focuses radiation from one focal point F1 into another focal point F2. The focal points are located on the long axis of the ellipsoid at a distance $f=(a2-b2)^{1/2}$ from the center of the ellipse, where 2a and 2b are the lengths of the major and minor axes, respectively. In case that the embodiment shown in FIG. 1 includes an LPP radiation source SO, the collector may be a single ellipsoidal mirror as shown in FIG. 3, where the light source SO is positioned in one focal point (F1) and an intermediate focus IF is established in the other focal point (F2) of the mirror. Radiation emanating from the radiation source, located in the first focal point (F1) towards the reflecting surface 70s and the reflected radiation, reflected by that surface towards the second focus point F2, is depicted by lines r in the drawing. For example, according to an embodiment, a mentioned intermediate focus IF may be located between the collector and an illumination system IL (see FIGS. 1, 2) of a lithographic apparatus, or be located in the illumination system IL, if desired.

Figure 4:
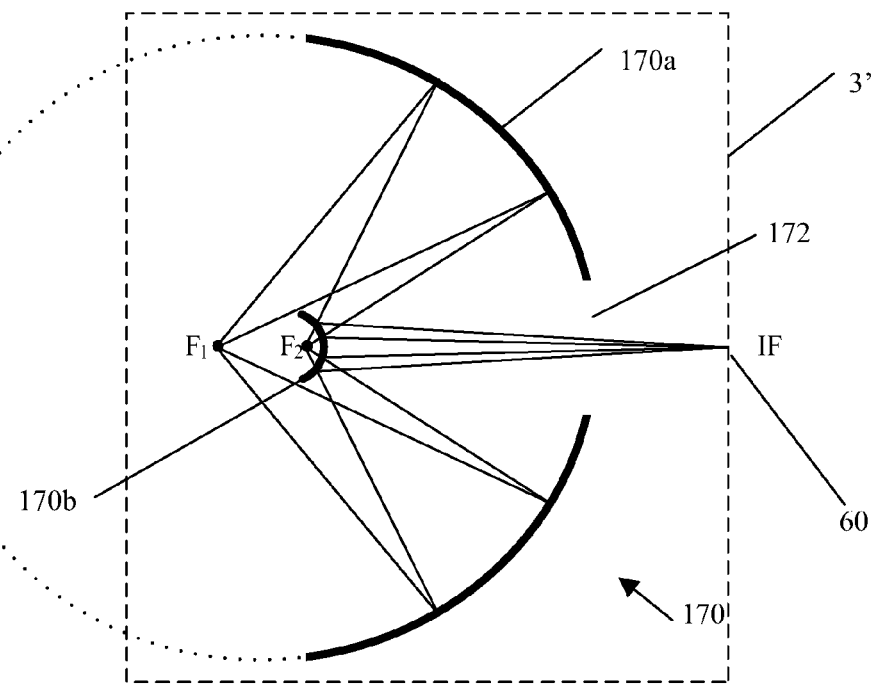
FIG. 4 depicts a radiation source and a Schwarzschild type normal incidence collector in accordance with an embodiment of the invention.

FIG. 4 schematically shows a radiation source unit 3' in accordance with an embodiment of the invention, in cross-section, including a collector 170. In this case, the collector includes two normal incidence collector parts 170a, 170b, each part 170a, 170b preferably (but not necessarily) having a substantially ellipsoid radiation collecting surface section. Particularly, the embodiment of FIG. 4 includes a Schwarzschild collector design, preferably consisting of two mirrors 170a, 170b. The source SO may be located in a first focal point F1. For example, the first collector mirror part 170a may have a concave reflecting surface (for example of ellipsoid or parabolic shape) that is configured to focus radiation emanating from the first focal point F1 towards the second collector mirror part 170b, particularly towards a second focus point F2. The second mirror part 170b may be configured to focus the radiation that is directed by the first mirror part 170a towards the second focus point F2, towards a further focus point IF (for example an intermediate focus). The first mirror part 170a includes an aperture 172 via which the radiation (reflected by the second mirror 170b) may be transmitted towards the further focus point IF. For example, the embodiment of FIG. 4 may beneficially be used in combination with a DPP radiation source.

In the present embodiment, the source SO is a LPP source, that is associated with a laser source configured to generate a laser beam of coherent light, having a predetermined wavelength. The laser light is focused onto a fuel (the fuel for example being supplied by a fuel supplier, and for example including fuel droplets) to generate radiation therefrom, in a laser produced plasma process. The resulting radiation may be EUV radiation, in this embodiment. In a non-limiting embodiment, the predetermined wavelength of the laser light is 10.6 microns (i.e., µm). For example, the fuel may be tin (Sn), or a different type of fuel, as will be appreciated by the skilled person.

The radiation collector 70 may be configured to collect radiation generated by the source, and to focus collected radiation to the downstream radiation beam emission aperture 60 of the chamber 3.

For example, the source SO may be configured to emit diverging radiation, and the collector 70 may be arranged to reflect that diverging radiation to provide a converging radiation beam, converging towards the emission aperture 60 (as in FIGS. 3 and 4). Particularly, the collector 70 may focus the radiation onto a focal point IF on an optical axis O of the system (see FIG. 2), which focal point IF is located in the emission aperture 60.

The emission aperture 60 may be a circular aperture, or have another shape (for example elliptical, square, or another shape). The emission aperture 60 is preferably small, for example having a diameter less than about 10 cm, preferably less than 1 cm, (measured in a direction transversally with a radiation transmission direction T, for example in a radial direction in case the aperture 60 has a circular cross-section). Preferably, the optical axis OX extends centrally through the aperture 60, however, this is not essential.

Because infrared radiation ("IR") that may be produced by the radiation source SO may cause heating of the mirrors downstream of the collector, as well as the reticle stage, it is desirable to filter the IR from the desired EUV radiation being provided to the patterning device MA. It may also be desirable to filter deep ultraviolet ("DUV") radiation (for example having a wavelength in a range of about 190-250 nm) from the EUV, because DUV may cause blurring of the EUV image in the resist on the substrate W.

Therefore, a spectral purity filter may be provided within the radiation beam path within the lithographic apparatus. Such a spectral purity filter may be arranged, for example, to pass EUV radiation but block or re-direct radiation of other wavelengths, in particular wavelengths that may be undesirable.

It will be appreciated that such a spectral purity filter may not fully block or re-direct radiation of an undesirable wavelength. Furthermore, a spectral purity filter may not be able to block or re-direct radiation in different ranges of undesirable wavelengths. Furthermore, spectral purity filters may undesirably reduce the intensity of the EUV radiation within the beam of radiation. Furthermore, a spectral purity filter may degrade or fail after a given period of time due to the conditions under which it may operate. For example, due to the overall intensity of the radiation within the beam of radiation, significant heating of the spectral purity filter may occur. Furthermore, the beam of radiation may be pulsed, which may result in fluctuating temperatures of some arrangements of spectral purity filters, including significant physical stress.

It has been realized that no single spectral purity filter is capable of meeting all of the desired requirements for a lithography apparatus, namely sufficient attenuation of undesired radiation wavelengths, including multiple different ranges of undesired wavelengths, sufficient transmission of desired wavelengths and sufficient durability within a lithographic apparatus. However, it has previously also been undesirable to include multiple spectral purity filters of any of the known arrangements due to the consequent compound attenuation of the desired radiation wavelength, such as EUV radiation. Attenuation of the desired radiation wavelength in the beam of radiation in a lithographic apparatus is undesirable because it may increase the time taken to form a desired pattern on a substrate, resulting in reduced throughput of the apparatus.

According to an embodiment of the present invention, two different arrangements of spectral purity filter are used within a lithographic apparatus. Beneficially, by using two different arrangements of spectral purity filter, it is possible to compensate for deficiencies of one form of spectral purity filter by the use of a different form of spectral purity filter.

For example, as is discussed in further detail below, the use of a first form of spectral purity filter may reduce the heating of a second spectral purity filter, enabling the selection of parameters for the second spectral purity filter to be optimized for, for example, filtering of a particular wavelength of radiation, with fewer constraints on the durability of the second filter. Accordingly, there may be significant benefits from selecting two different types or arrangements of spectral purity filter in comparison to providing a lithographic apparatus with two spectral purity filters of a single design.

In embodiments of the present invention, the two different spectral purity filters may be selected from at least grating spectral purity filters, membrane spectral purity filters, grid spectral purity filters and anti reflection coatings, as discussed below. It should be appreciated that more than two different types of spectral purity filter may also be used.

Figure 5:
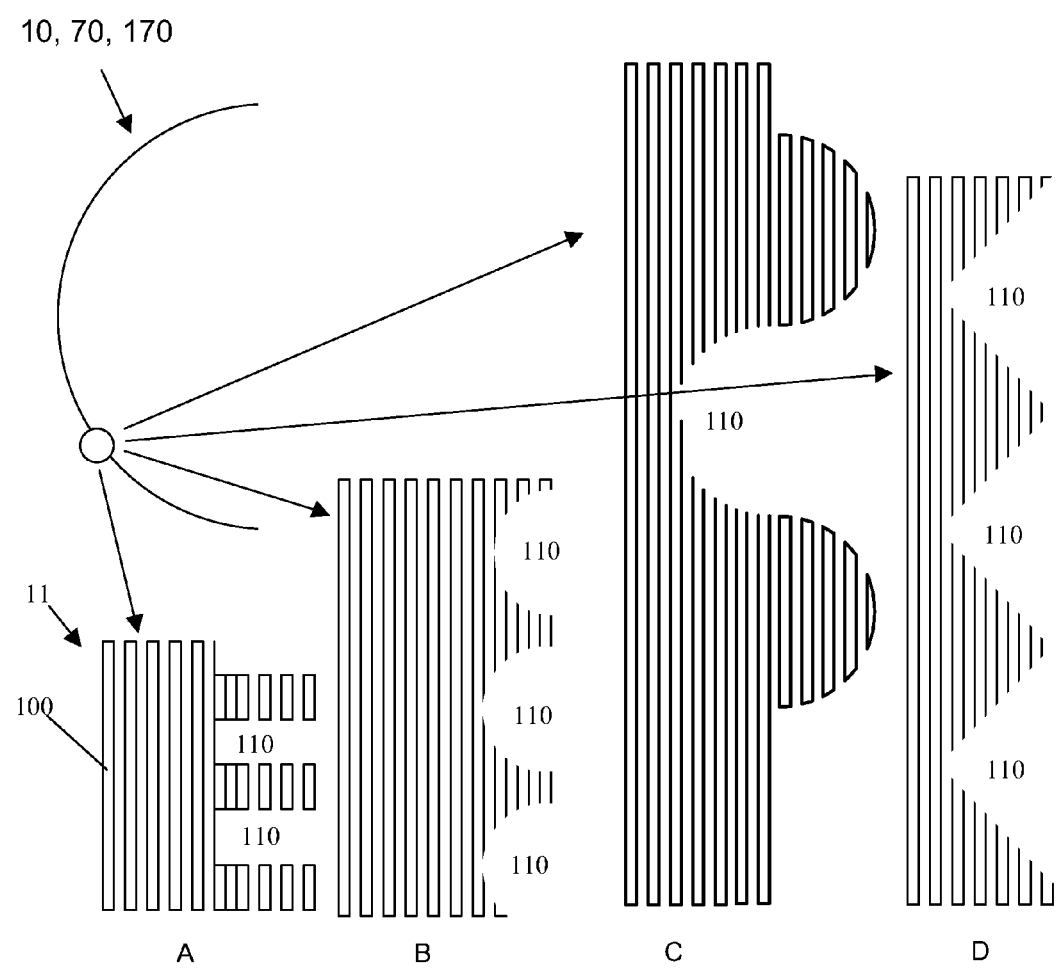
FIG. 5 depicts embodiments of a spectral purity filter that may be used in the lithographic apparatus of FIG. 1.

Non-limiting embodiments of a grating spectral purity filter 11 are illustrated in FIG. 5 and are represented as A, B, C, and D. As discussed in further detail below, the grating spectral purity filter may be provided on a mirror of any of the collectors discussed above, to a mirror in the illumination system IL, such as mirrors 18 or 19 shown in FIG. 2 or any reflector in the lithography apparatus.

It is desirable, although not necessary, for the spectral purity filter 11 to fulfill the following specification:

| Region | At IF [W] | After SPF [W] (transmission) | Absorbed + Reflected power at SPF [W] |
|---|---|---|---|
| in-band EUV | 130 | >105 | <25 |
| OoB EUV 9-21 nm | 100 | <80 | >20 |
| OoB EUV 5-130 nm | 250 | <200 | >60 |
| DUV 130-400 nm | 200 | <2 | >198 |
| VIS-NIR | 10 | <5 | >5 |
| IR | 10 | <1 | >9 |
| 10.6 um | 260 | <26 | >234 |

In order for the collector to remain reflective for radiation having a wavelength of 13.5 nm (EUV), the grating spectral purity filter 11 includes a coating that is applied to a smooth (e.g., polished) substrate that is typically used for the collector. The coating may comprise a plurality of layers (see FIG. 5) that alternate in material so as to create a so-called multilayer stack 100 on the smooth substrate. In an embodiment, the multilayer stack 100 may include a plurality of alternating layers in the order of about 1000 and have a total thickness of about 7 µm. Any suitable combination of materials for the alternating layers that are known in the art may be used.

After the multilayer stack 100 has been applied to the smooth substrate, a top side of the multilayer stack may be etched, mechanically processed using, for example, diamond turning or sputtered away in, for example, a random square (see A in FIG. 5), a random saw (see D in FIG. 5), or a random wave pattern (see B and C in FIG. 5) to create a plurality of recesses 110 in the top side of the multilayer stack 100 thereby forming the grating spectral purity filter 11.

In an embodiment, the recesses 110 may have a symmetric cross-section, for example as shown in FIG. 5.

In an embodiment, the recesses 110 may have about a depth of about one-fourth of the wavelength of the undesired radiation, i.e., □/4, and suitable profile see FIG. 5) that allow the recesses to either scatter (about 50×), or reflect the 0 order of the undesired radiation (e.g., IR and/or DUV) in a direction that is different than the direction that the desired EUV radiation is reflected. At the same time, the EUV contrast may be determined by the plurality of alternating layers in the multilayer stack, as is known in the art. The desirable EUV radiation may be reflected to the intermediate focus IF, either directly, or with the use of additional mirrors.

The grating spectral purity filter 11 of FIG. 5 is configured to enhance a spectral purity of the radiation that is to be emitted via the aperture 60 (shown in FIGS. 3 and 4). In an embodiment, the filter 11 is configured to transmit only a desired spectral part of radiation towards the aperture 60. For example the filter 11 may be configured to reflect, block, or redirect other 'undesired' spectral parts of the radiation. Preferably, the filter 11 is configured to provide a combination of one or more of blocking, redirecting and reflecting other 'undesired' spectral parts of the radiation.

In accordance with an embodiment, a desired spectral part (i.e., to be emitted via the aperture 60) is FIN radiation (for example having a wavelength lower than 20 nm, for example a wavelength of 13.5 nm). The filter 11 may be configured to transmit at least 50%, preferably more than 80%, of incoming radiation (i.e., radiation that is directed towards the filter from the source SO) of that desired spectral part. For example, to filter out radiation having a wavelength $\lambda$ of about 10 μm, the recesses in the top side of the multilayer stack may be about 2.5 μm deep.

In an embodiment, the spectral purity filter may also include a thin coating that is provided to the top side of the multilayer stack after the recesses have been created. The coating may have a thickness of about 0.2 nm to about 1 nm. The coating may include a metal that exhibits high electrical conductivity and does not oxidize. For example, the metal may be selected from the group consisting of Ru, Pd, Pt, Rh, Ro, Ti, Au, Mo, Zr, Cu, Fe, Cr, Ni, Zn, and Ag. In an embodiment, the metal may be selected from the group consisting of Ru, Pd, Pt, Rh, Ro, Ti, and Au.

In an embodiment, a reflective multilayer stack may be deposited to a polished collector mirror. The reflective multilayer stack may be provided with a grating spectral purity filter by wet etching, dry etching, scratching or other mechanical process and/or using any suitable lithographic techniques to transfer the desired spectral purity filter to the reflector surface.

In an embodiment, the reflective multilayer stack may be deposited onto a substrate and the grating spectral purity filter, formed as above. The substrate, including the multilayer reflector and grating spectral purity filter may then be attached to the polished collector mirror with, for example, a suitable adhesive.

FIGS. 8a to 8g depict a process by which a grating spectral purity filter for use in the present invention may be formed. As shown, the process commences with a substrate 300, which may, for example, be the polished collector mirror.

A reflective multilayer stack 301 is formed on a surface of the substrate 300. A layer of radiation sensitive material, such as a resist 302, is deposited on top of the reflective multilayer stack 301. An interference pattern of the radiation 303 is then projected onto the radiation sensitive layer 302. The material of the radiation sensitive layer 301 is then developed in order to produce a patterned mask 304 on the surface of the reflective multilayer stack 301. The surface is then etched, for example, chemically etched, such that the patterned mask 304 produces, under the influence of the etch, a textured surface, 305 on the surface of the reflective multilayer stack 301, forming the spectral purity filter. Finally, if required, a thin coating 306 may be formed on the topside of the multilayer stack, as discussed above.

It will be appreciated that, as discussed above, the substrate 300 may be the component on which it is desired to form the grating spectral purity filter, such as a reflector. Alternatively, the substrate may be a separate component on which the spectral purity filter is formed and which is then attached to the component on which the spectral purity filter is desired to be located.

Figure 9:
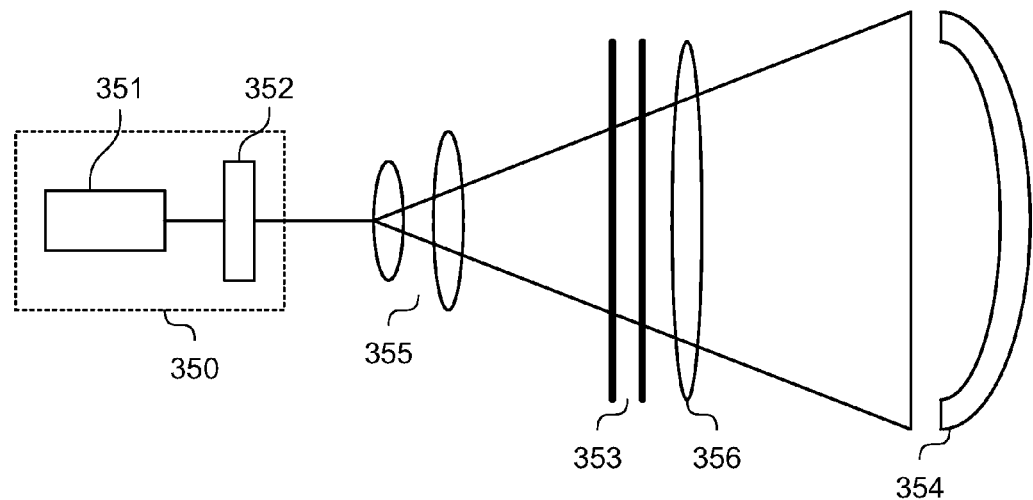
FIG. 9 depicts a system for projecting an interference pattern of radiation onto a target for use in the method depicted in FIGS. 8a to 8.

FIG. 9 schematically depicts a system that may be used to project an interference pattern of radiation onto the substrate during the formation of a grating spectral purity filter using the method depicted in FIGS. 8a to 8g. It will be appreciated, however, that alternative systems may be provided in order to project an interference pattern of radiation onto the surface on which the grating spectral purity filter is to be formed.

As shown in FIG. 9, the system may include a narrow band source of radiation 350. For example, the narrow band source of radiation 350 may include a UV source 351 and a narrow band filter 352. The system further includes an arrangement for introducing an interference pattern into the beam of radiation produced by the narrow band source of radiation 350. For example, as depicted in FIG. 9, an etalon 353 may be provided (also known as a Fabry-Pérot interferometer). In addition, optical components may be provided in order to appropriately project the interference pattern onto the target 354. For example, as shown, aspherical beam-expander optics 355 may be provided between the radiation source 350 and the etalon 353 and a field lens 356 may be provided between the etalon and the target 354.

It will be appreciated that if an arrangement such as that depicted in FIG. 9 is used, the interference pattern of radiation projected onto the target 354 may be adjusted by adjustment of the wave length of radiation used, the intensity of the beam of radiation and/or by adjusting the etalon spacing.

It should also be appreciated that the method of forming a grating spectral purity filter as discussed above, in particular using an arrangement such as depicted in FIG. 9 to project an interference pattern of radiation onto a substrate, may enable the formation of the requisite textured surface on a relatively large component, such as a collector mirror as discussed above. Furthermore, such a system may be beneficial because it may be applicable to the formation of a textured surface, and therefore the formation of a spectral purity filter as discussed above, on a curved surface.

According to an aspect of the invention, the lithographic apparatus may use two grating spectral purity filters, each arranged with different radiation filtering structures from each other.

In an embodiment, the two different grating spectral purity filters may be provided on different reflectors within the lithographic apparatus. Accordingly, both may be formed from a multilayer stack having a plurality of recesses formed in the top surface, as discussed above. For both grating spectral purity filters, the multilayer stack may be configured such that radiation of a first wavelength, such as EUV radiation, is reflected in a first direction relative to the multilayer stack. The recesses may be configured such that radiation of a different wavelength from the first wavelength is reflected in a different direction from the first direction in order to filter undesired radiation wavelengths.

In an embodiment of the present invention, the recesses of the first grating spectral purity filter have a different dimension from the recesses of the second grating spectral purity filter, namely a different radiation filtering structure. Accordingly, the two grating spectral purity filters may be used to filter different wavelengths of radiation from the optical path. For example, one grating spectral purity filter may be configured in order to suppress infrared radiation, for example having a wavelength of approximately 10.6 µm and the second grating spectral purity filter may be configured to suppress or remove DUV radiation.

In an embodiment of the present invention, both the first and the second spectral purity filters may be provided together on one reflector within the lithographic apparatus. FIGS. 10 and 11 schematically depict two arrangements of possible combinations of two grating spectral purity filters. As shown, as with the grating spectral purity filters discussed above, the grating spectral purity filters depicted in FIGS. 10 and 11 are formed from a multilayer stack 100, in which a first plurality of recesses 110 are formed. As with the spectral purity filters discussed above, the multilayer stack 100 may be configured to reflect radiation of a first wavelength in a first direction relative to the multilayer stack 100 and the first plurality of recesses 110 may be configured to reflect radiation of a second wavelength in a second direction relative to the multilayer stack 100, that is different from the first direction.

In addition to the plurality of first recesses 110, a second plurality of recesses 120, 121 are formed. As shown in FIGS. 10 and 11, the second plurality of recesses 120, 121 are smaller than the first plurality of recesses 110 and are formed on the remaining top surface 100a of the multilayer stack 100, between the recesses 110 of the first plurality of recesses, and on the lower surface 110a of each of the recesses 110.

The second plurality of recesses 120, 121 may be configured to reflect a third wavelength of radiation, different from the first and second wavelengths of radiation, in a direction that is also different from the first direction.

Accordingly, for example, the multilayer stack 100 may be used to transmit radiation of the first wavelength along the optical path of the lithographic apparatus, the first plurality of recesses 110 may be used to remove or suppress a second radiation wavelength in the optical path and the second plurality of recesses 120, 121 may be used to remove or suppress a third radiation wavelength from the optical path.

As with the grating spectral purity filters depicted in FIG. 5, the first and second pluralities of recesses may have any desired cross-section and may, in particular, have a symmetrical cross-section. In the examples depicted in FIGS. 10 and 11, the first plurality of recesses 110 may have a rectangular cross section, also referred to as "binary gratings". An advantage of a rectangular cross-section for the first, larger, plurality of recesses 110 is that they may be formed by a mechanical process, such as diamond turning. This may reduce the cost of producing a reflector having combined first and second grating spectral purity filters.

In the example depicted in FIG. 10, the second plurality of recesses 120 also have a rectangular cross-section. An advantage of such an arrangement is that the majority of the exposed surface of the multilayer stack may be a single layer of the multilayer stack. Accordingly, if the multilayer stack is formed from two alternating layers, one of which is more susceptible to degradation in the environment in which the reflector is to be used than the other, the combined grating spectral purity filter may be configured such that the top layer, which is primarily exposed, is formed from the one of the two materials of the multilayer stack that is least susceptible to degradation. Accordingly, the lifetime of the combined grating spectral purity filter may be increased.

In the example depicted in FIG. 11, the second plurality of recesses 121 are blazed, namely have a triangular cross-section. An advantage of using a blazed grating is that the grating may reflect a broader range of wavelengths in the first direction, and therefore be used to suppress or remove those wavelengths from the optical path, than is possible using a binary grating. This may be particularly beneficial if it is to remove or suppress DUV radiation, which may be present across a significant range of wavelengths.

As is discussed above, selection of the depth of the recesses 110, 120, 121 may be used to select the radiation wavelength that the two grating spectral purity filters remove or suppress from the optical path of the lithographic apparatus. The pitch of the recesses 110, 120, 121 may be used to control the divergence between the first direction, namely the direction of radiation that is reflected by the multilayer stack 100, and the second and third directions, namely the direction of the radiation reflected by the first and second pluralities of recesses 110, 120, 121. Accordingly, the undesired radiation may effectively form a cone surrounding the optical axis of the beam of radiation, the desired radiation remaining on axis. Accordingly, if the beam of radiation is directed through an aperture from the grating spectral purity filter, for example at a point of intermediate focus between the radiation source and the illumination system, the undesirable radiation may not pass through the aperture but may be incident on, and absorbed by, a wall of the system, such as a wall of the evacuation chamber in which the source and/or illumination system may be located.

If desired, the pitch of the two pluralities of recesses may be selected such that the second and third directions are the same. In such an arrangement, both radiation wavelengths being removed or suppressed from the optical path may be reflected out of the optical path of the lithographic apparatus in a common direction to a common radiation sink.

Alternatively, the second and third directions may be different and separate radiation sinks may be provided for the two radiation wavelengths being suppressed or removed from the optical path.

In an embodiment, the first plurality of recesses 110 may have a depth of between approximately 1.5 µm to 3 µm, desirably approximately 2.65 µm. The pitch of the first plurality of recesses 110 may be approximately 2 mm. Such an arrangement may be used to remove or suppress infrared radiation from the optical path of the lithographic apparatus, in particular radiation of a wavelength of 10.6 µm.

The second plurality of recesses 120, 121 may, for example, have a depth of between approximately 25 nm to 75 nm, desirably approximately 50 nm and may have a pitch of, for example 0.04 mm. Accordingly, the second plurality of recesses 120, 121 may form a second grating spectral purity filter suitable for removing or suppressing DUV radiation from the optical path of the lithographic apparatus.

According to an embodiment, a grating spectral purity filter as discussed above may be configured to filter at least part of radiation having the predetermined wavelength of the coherent laser light from the radiation source, from the radiation that is to be emitted. Particularly, a desired part of radiation that is to be emitted has a significantly lower wavelength than the coherent laser light. The wavelength of the coherent laser light may be, for example, larger than 10 microns. In an embodiment, the coherent laser light, to be filtered out, has a wavelength of 10.6 microns.

In the above, a grating spectral purity filter has been applied in radiation systems, including a radiation collector. In an embodiment, a grating spectral purity filter of any of the arrangements discussed above may be applied to mirrors in the illumination system IL of the lithographic apparatus or other reflectors in a lithographic apparatus.

By combining a grating spectral purity filter with the collector mirror, the out of band radiation may be dealt with closer to its source so that no additional EUV (or minimal) loss is realized due to implementation of filtering techniques more upstream of the so-called optical column. Because the grating spectral filter is positioned at the largest surface in the optical column, it may have relatively low power loads. Furthermore, a long optical path until the intermediate focus IF is available, which may allow for small diverting angles to be used to prevent the unwanted radiation from leaving the source SO and entering the illuminator IL. The grating spectral purity filter of embodiments of the present invention may remain working in a hostile environment and as a result may not need to be replaced by costly filters, thereby potentially saving money.

Figure 6:
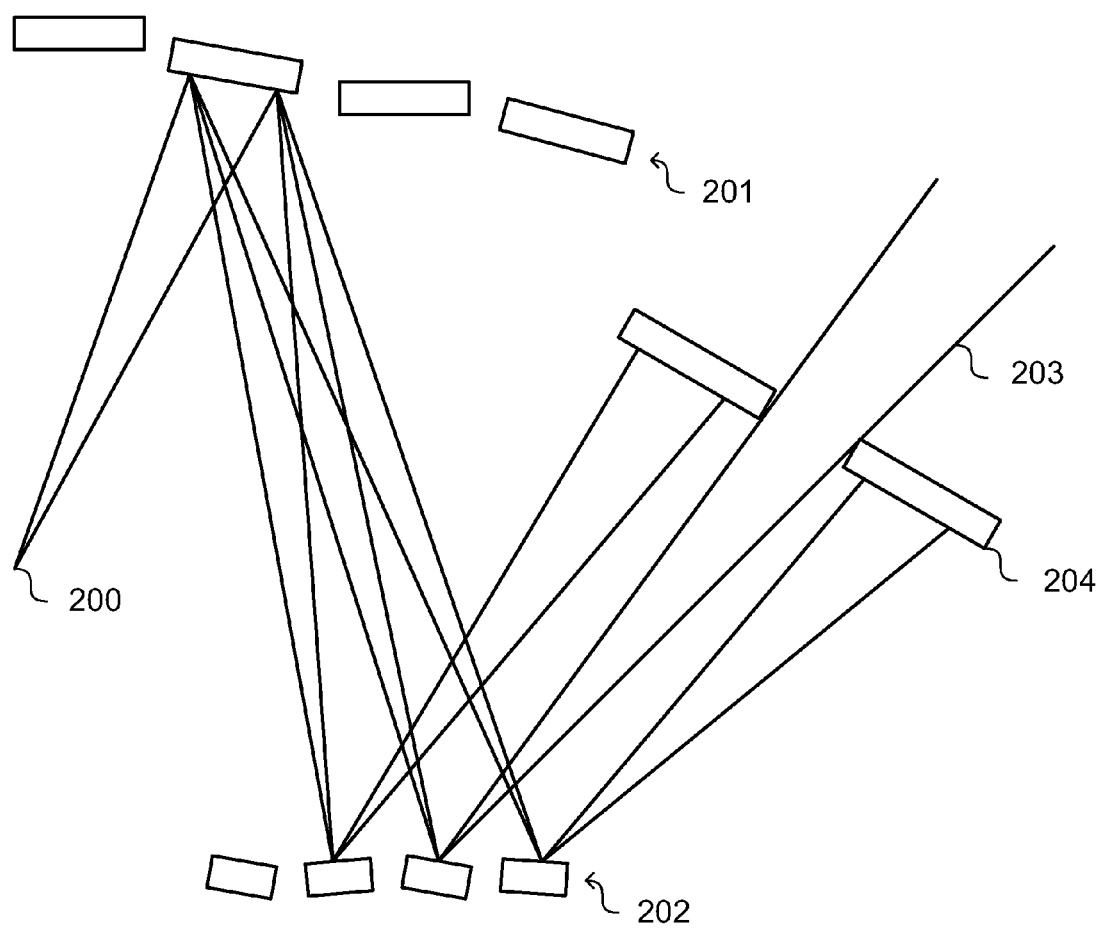
FIG. 6 depicts an arrangement of a radiation beam conditioning system using a spectral purity filter according to the present invention.

FIG. 6 depicts schematically a part of an illumination system that may be provided for use in a lithographic apparatus according to an embodiment of the present invention. In particular, the arrangement depicted in FIG. 6 may be provided in order to at least partially condition a beam of radiation.

As shown in FIG. 6, radiation is provided from a point of intermediate focus 200 to a first array of reflectors 201, which each focus a portion of the beam of radiation onto a respective reflecting element in a second array of reflecting elements 202. Each of the reflecting elements in the second array of reflecting elements 202 is configured to direct the radiation incident on the reflector of the second array of reflectors 202 into a conditioned beam of radiation 203 to be provided by the radiation beam conditioning device.

The conditioned beam of radiation 203 may be, for example, directed onto a patterning device that is used to impart a pattern to the beam of radiation as part of the lithography process. In such an arrangement, each of the reflectors in the second array, of reflectors 202 may be configured such that the field of the associated element in the first array of reflectors 201 is imaged onto the patterning device. Such an arrangement is commonly known as a "fly's eye integrator". In such an arrangement, the reflectors of the first array of reflectors 201 are commonly referred to as field facet mirrors and the reflectors of the second array of reflectors 202 are commonly referred to as pupil facet mirrors. As will be appreciated, such an arrangement is configured such that the field at the patterning device (or at the outlet of the radiation beam conditioning device) consists of a plurality of overlapping images of the first array of reflectors 201. This provides a mixing of the radiation from the point of intermediate focus 200, namely of the radiation emitted by a radiation source, providing improved illumination uniformity.

In the arrangement depicted in FIG. 6, each of the reflectors of the first array of reflectors 201 is provided with a grating spectral purity filter according to one of the arrangements discussed above.

Furthermore, the first and second arrays of reflectors 201,202 are configured such that radiation having the desired wavelength is reflected from each reflector of the first array of reflectors 201 to a respective reflector of the second array of reflectors 202. The respective reflectors of the second array of reflectors 202 are appropriately configured to reflect the radiation of the desired wavelength to form a part of the conditioned beam of radiation 203. Radiation of undesired wavelengths, on the other hand, is reflected from each reflector of the first array of reflectors 201 in a different direction and therefore incident on a different reflector of the second array of reflectors 202. In this case, the radiation of the undesired wavelength reflects from the reflector of the second array of reflectors 202 on which it is incident in such a manner that it does not form a part of the conditioned beam of radiation 203.

In a preferred arrangement, as depicted in FIG. 6, a radiation absorber 204 is provided that is configured to absorb the radiation of the undesired wavelengths that is reflected in a direction such that it does not form part of the conditioned beam of radiation 203. For example, the radiation absorber 204 may be arranged in the form of an aperture that permits radiation of the desired wavelength that has been reflected in a first direction, to pass through the aperture to form the conditioned beam of radiation 203 but absorbs radiation of the undesired wavelength that is reflected in a different direction.

It should be appreciated that in an arrangement such as that depicted in FIG. 6, radiation having undesired wavelengths may be reflected by each of the reflectors of the first array of reflectors 201 onto a plurality of reflectors of the second array of reflectors 202. In addition, each of the reflectors of the second array of reflectors 202 may both receive radiation from a first reflector in the first array of reflectors 201 having the desired wavelength, reflecting such desired radiation such that it is included in the conditioned beam of radiation 203, and receive radiation from one or more other reflectors of the first array of reflectors 201 that has an undesired wavelength, reflecting such undesired radiation such that it does not form part of the conditioned beam of radiation 203.

Figure 7:
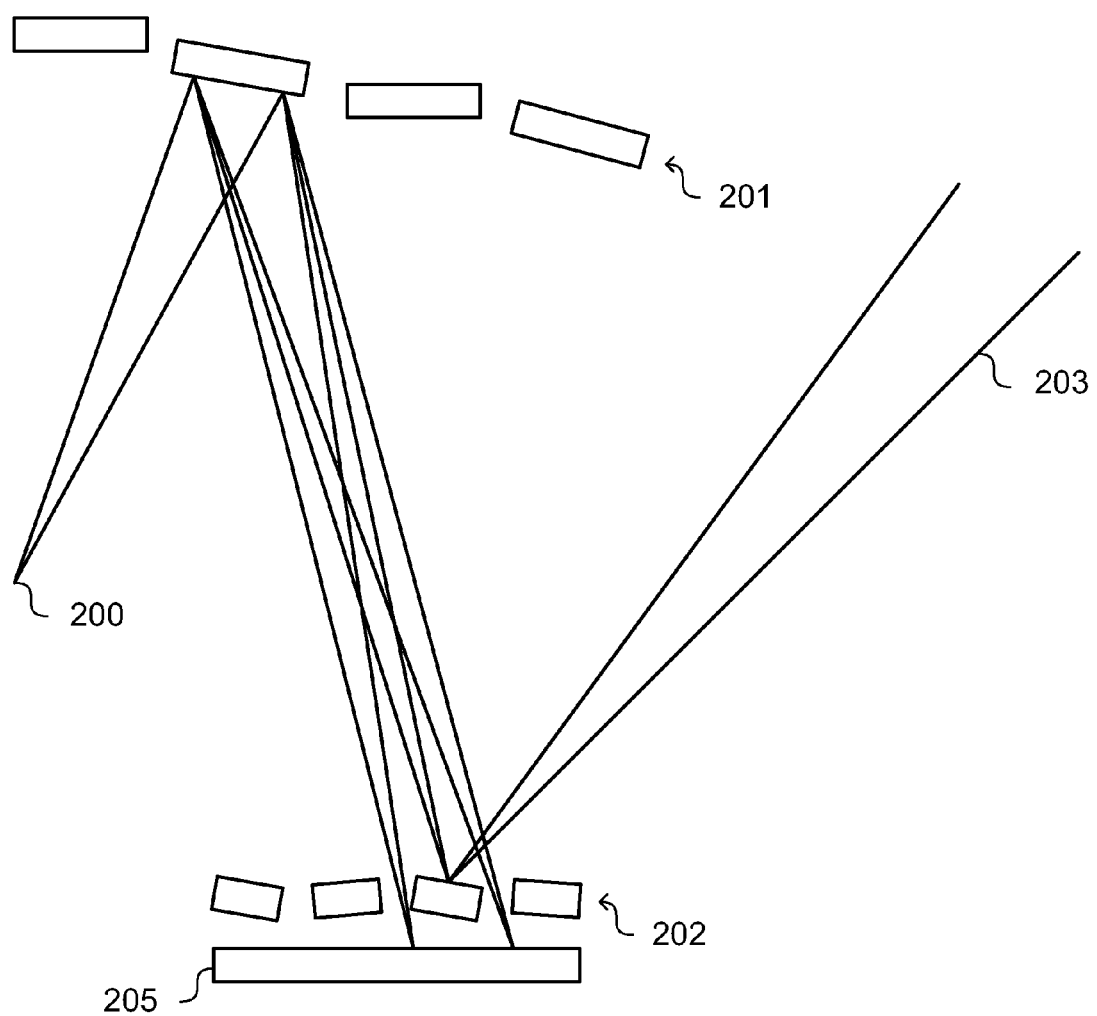
FIG. 7 depicts a variant of the arrangement depicted in FIG. 6.
Figure 8A:
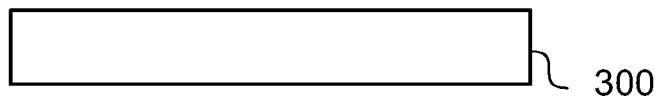
FIGS. 8a to 8g depict a method of forming a spectral purity filer.
Figure 8B:
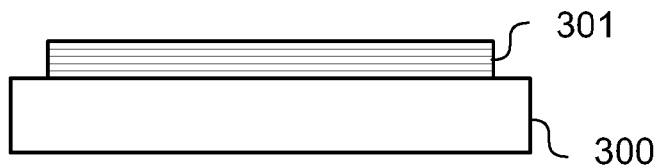
Figure 8C:
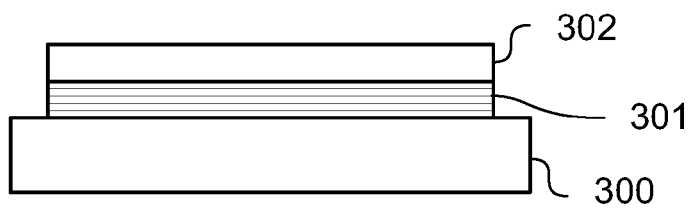
Figure 8D:
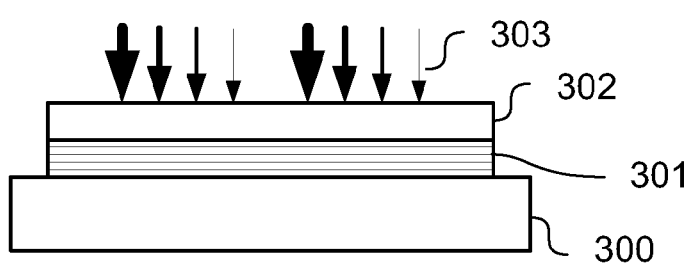
Figure 8E:
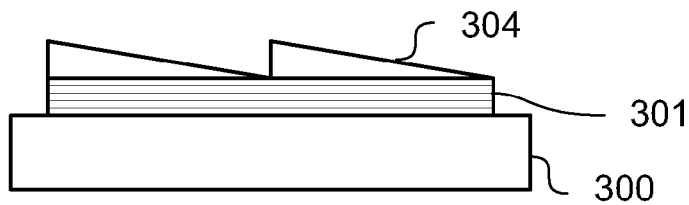
Figure 8F:
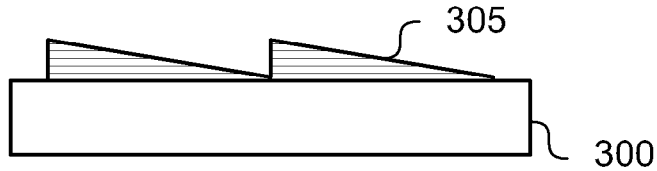
Figure 8G:
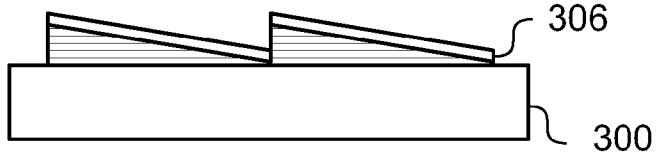

FIG. 7 schematically depicts an arrangement that is similar to the arrangement depicted in FIG. 6. Accordingly, description of corresponding features will be omitted for brevity. The difference between the arrangement depicted in FIG. 7 and the arrangement depicted in FIG. 6 is that the first and second arrays of, reflectors 201,202 are configured such that the radiation of undesired wavelengths is reflected from each reflector of the first array of reflectors 201 such that the radiation is directed to a space between two of the reflectors of the second array of reflectors 202. Accordingly, only radiation of the desired wavelength is reflected by the reflectors of the first array of reflectors 201 onto the reflectors of the second array of reflectors 202 and subsequently form part of the conditioned beam of radiation 203. As shown in FIG. 7, a radiation absorber 205 may be provided on the opposite side of the second array of reflectors 202 from the first array of reflectors 201. The radiation absorber 205 may be configured to absorb the radiation of the undesired wavelengths that passes between the reflectors of the second array of reflectors 202.

The radiation absorbers 204;205 of the arrangements depicted in arrangements depicted in FIGS. 6 and 7 may be provided with a cooling system in order to dissipate the heat resulting from the absorption of the radiation of the undesired wavelengths.

It should also be appreciated that, although the arrangements depicted in FIGS. 6 and 7 are such that the grating spectral purity filters are provided on the reflectors of the first array of reflectors 201, alternative arrangements may be provided in which the grating spectral purity filters are alternatively or additionally provided on the reflectors of the second array of reflectors 202. In either case, the grating spectral purity filters may be arranged such that radiation of the desired wavelength is directed such that it forms the conditioned beam of radiation while radiation having undesired wavelengths is directed in one or more different directions and may be absorbed by an appropriate radiation absorber.

The arrangements of FIGS. 6 and 7 may beneficially prevent undesired wavelengths of radiation from passing into the remainder of a lithographic apparatus. In addition, it may be easier to form the grating spectral purity filters on the reflectors of the arrays of reflectors used in the radiation beam conditioning system than it is to form the grating spectral purity filter on, for example, the collector mirrors as discussed above. Furthermore, the environment within which the collector mirrors operate may be such that the useful lifetime of the grating spectral purity filter formed on the collector mirror may be shorter than the useful lifetime of the grating spectral purity filter when formed on the reflectors of the radiation beam conditioning system depicted in FIGS. 6 and 7.

An example of a membrane spectral purity filter 130 is depicted in FIG. 12. As shown, the membrane spectral purity filter 130 is formed from a thin film of material 131 that may be supported by a frame 132. The beam of radiation 133 to be filtered is directed at, and passes through, the thin film of material 131. The thin film of material 131 is selected to be as transparent as possible to the desirable wavelengths of radiation and not transparent to the undesirable radiation wavelength. For example, the thin film 131 may be formed from layers of Zr and Si. The thin film may, for example, have a thickness in the range from about 50 nm to approximately 250 nm.

In order to support the thin film 131, a supporting mesh may be provided. The mesh may increase the durability of the membrane spectral purity filter 130 but may reduce its transparency to the desirable radiation wavelengths. It will be appreciated that the present invention may be implemented with any presently known membrane grating spectral purity filter.

The membrane grating spectral purity filter 130 may be used at any of a variety of locations within the lithographic apparatus. However, it may be preferable to locate the membrane spectral purity filter 130 at locations selected such that the beam of radiation only passes through the thin film or material 131 once. This is because, although the thin film of material 131 is selected to be as transparent as possible to the desirable radiation wavelengths, such as EUV radiation, each time the beam of radiation 133 passes through the membrane spectral purity filter 130, the intensity of the desirable radiation wavelength will be attenuated. The compound effect of passing the beam of radiation through the thin film of material 131 may therefore result in unacceptable attenuation of the intensity of the desirable wavelength of radiation. Therefore, for example it may not be appropriate to use the membrane spectral purity filter 130 adjacent a folding mirror within the lithographic apparatus, at which the optical path of the beam of radiation is substantially bent back upon itself.

In an embodiment, it may be desirable to arrange a membrane spectral purity filter 130 close to the point of intermediate focus 12 discussed above, namely the virtual point source that may be provided in the beam of radiation for entry into the illumination system IL. Accordingly, for example, the membrane spectral purity filter 130 may be provided as the last element before the intermediate focus point 12 or the first element after the intermediate focus point 12. In either case, it will be appreciated that the membrane spectral purity filter 130 may be provided as part of the radiation system or as part of the illumination system. Such an arrangement may be beneficial because the location is provided in the optical path of lithographic apparatus relatively close to the radiation source. In general, the closer to the radiation source along the optical path, the wider the beam of radiation and therefore the lower the radiation intensity incident on a given area of the thin film of material 131.

In an embodiment of the present invention, the illumination system IL may include a grazing incidence reflector. In particular, the grazing incidence reflector may be the last optical element in the illuminator. The membrane spectral purity filter 130 may be arranged adjacent to the grazing incidence reflector because at such a location it may be configured such that the beam of radiation only passes through the thin film of material 131 once.

Accordingly, for example, the membrane spectral purity filter 130 may be arranged as the last element in the optical path before the grazing incidence reflector or the first element in the optical path after the grazing incidence reflector.

The membrane spectral purity filter may be arranged such that the surface of the thin film of material 131 is substantially perpendicular to the optical axis of the beam of radiation. Alternatively, it may be arranged to be at an oblique angle. For example, if the membrane spectral purity filter 30 is arranged adjacent the intermediate focus point 12, it may be arranged at an angle of approximately from 1 to 30° C., for example approximately 15° C. If the membrane spectral purity filter 130 is adjacent the grazing incidence reflector, it may be arranged at an angle of approximately from 20 to 65° C.

It will be appreciated that other locations and/or arrangements for the membrane spectral purity filter may also be considered.

An example of a grid spectral purity filter 140 is depicted schematically in FIG. 13. As shown, the grid spectral purity filter 140 may be formed from one or more apertures 141 formed in a substrate 142. The one or more apertures 141 may, as depicted in FIG. 13 be an array of pinholes. However, this is not essential and the aperture(s) may have any appropriate cross-section including, for example, a slit of a given width. Each aperture 141 reflects substantially all radiation with wavelengths for which the aperture width is below the diffraction limit, the diffraction limit being half the wavelength in the medium that fills the aperture 141 (which may be vacuum). For aperture widths above the diffraction limit, a substantial fraction of the radiation is transmitted through the aperture.

As an example, for a slit with a 100 nm width, substantially all light with wavelengths larger than 200 nm is reflected.

Accordingly, by appropriate selection of the width of the one or more apertures 141, the grid spectral purity filter 140 may be configured to transmit a desired radiation wavelength, such as EUV radiation and reflect radiation having a longer wavelength.

It will be appreciated that the transparency of the grid spectral purity filter 40 to the desired wavelength of radiation will be dependent on the proportion of the area on which the beam of radiation 143 is incident that is open. Accordingly, because the width of the one or more apertures 141 may be small, in particular if it is desirable to be transparent to EUV radiation, a plurality of apertures 141 may be provided, as depicted in FIG. 13.

Although FIG. 13 depicts a periodic array of apertures 141, any suitable array forming a regular or irregular pattern may be used. In certain circumstances, it may be desirable to vary the spacing between the apertures 141 in order to avoid unwanted diffraction effects due to the periodicity of constant spacing between the apertures 141.

The apertures 141 may be formed using lithographic and/or micro-machining techniques. For example, a micro-machining technique involves defining apertures in a layer on top of a silicon wafer by photolithography followed by etching deep into the silicon wafer. In order to open the apertures 141, a window is etched into the back side of the silicon wafer, for example by using KOH etching techniques. It will be appreciated, however, that any known grid spectral purity filter may be used in the present invention.

A grid spectral purity filter 140 may be used at any desired location within the lithographic apparatus. However, as with the membrane spectral purity filter discussed above, it may be preferable to locate the grid spectral purity filter at a position in which the beam of radiation 143 only passes through the grid spectral purity filter 140 in a single direction. As with the membrane spectral purity filter 130, this may reduce unwanted attenuation of the desirable radiation wavelength in the beam or radiation.

Furthermore, it may be desirable to locate the grid spectral filter 140 at a location that is relatively close to the radiation source because the attenuation of the desirable radiation wavelength is greater if the radiation is incident on an aperture 141 at an angle.

In an embodiment, the grid spectral purity filter 140 may be located close to the point of intermediate focus 12 discussed above provided for the entry of the beam or radiation into the illumination system IL. For example, as with the membrane spectral purity filter 130, the grid spectral purity filter 130 may be provided as the final element before the point of intermediate focus 12 or as the first component after the point of intermediate focus 12. Likewise, the grid spectral purity filter 140 may be provided as part of the radiation system or part of the illumination system.

FIG. 14 schematically depicts an arrangement of an anti reflection coating 150 that may be used as a spectral purity filter in the present invention. As depicted, it may be formed from a thin film of material 151 formed on the surface of a reflector 152 within the lithographic apparatus. It will be appreciated that the thin film 151 may be provided on any one of the reflectors within the lithographic apparatus. Furthermore, it may be provided on a plurality of the reflectors within the lithographic apparatus. The thin film 151 may be selected such that it substantially does not affect the reflective properties of the reflector 152 for the desirable radiation wavelength of the beam or radiation 153 but inhibits reflection of one or more undesirable radiation wavelengths.

The thin film 151 may be formed from a dielectric coating, for example formed from silicon nitride, silicon oxide or any other suitable material. It will be appreciated that any known anti reflection coatings may be used as spectral purity filters in the present invention.

As described above, in an embodiment of the present invention, two different spectral purity filters are used. The combination of two different spectral purity filters may provide particular benefits.

For example, it may be desirable to provide a grating spectral purity filter on the collector, as discussed above. However, this may not provide sufficient removal of the infrared radiation. In particular, for example, an arrangement of a grating spectral purity filter may reduce the intensity of the infrared radiation within the beam of radiation to approximately 2% of its initial value but it may be desirable to have the infrared radiation reduced to 0.02% of its initial value.

Accordingly, in an embodiment, the lithographic apparatus may include a grating spectral purity filter in combination with a membrane spectral purity filter. For example, a membrane spectral purity filter may reduce the infrared radiation in a beam of radiation to 1% of the received intensity. Therefore, the combination of both spectral purity filters in combination may reduce the intensity of the infrared radiation to 0.02% of its initial intensity.

Using these two different spectral purity filters provides additional benefits. In particular, for example, a single grating spectral purity filter configured to remove infrared radiation may not reduce the intensity of the DUV radiation in the radiation beam. However, the membrane spectral purity filter may provide the require reduction in DUV radiation.

Furthermore, a problem with some configurations of EUV lithographic apparatus is the transmission of Sn particles from the radiation source into the remainder of the apparatus. These may degrade the performance of the optical components within the lithographic apparatus or, more critically, may damage a patterning device. The provision of a membrane spectral purity filter, for example adjacent to the point of intermediate focus 12, as discussed above, may significantly reduce the transmission of Sn particles without significant reduction in the properties of the membrane spectral purity filter. However, it is not always possible to provide a membrane spectral purity filter due to the lack of durability of membrane spectral purity filters. However, the use of a grating spectral purity filter may effectively protect the membrane spectral purity filter, permitting its use.

The provision of the grating spectral purity filter may, in particular, permit the use of the membrane spectral purity filter in a desirable form and/or at a desirable location. For example, without the grating spectral purity filter, particularly located closer to the radiation source than the membrane spectral purity filter, the heat load on the membrane spectral purity filter may be too large, either preventing its use at a particular location or resulting in an unacceptably short period of use before the membrane spectral purity filter would need to be replaced. The provision of the grating spectral purity filter may very significantly reduce the heat load on the membrane spectral purity filter.

Furthermore, by reducing the load of infrared radiation on the membrane spectral purity filter, it may be made from materials that are relatively absorbing of infrared. This, in turn, means that it will have increased emissivity at infrared and so will cool more quickly, which may be beneficial.

Furthermore, the provision of the grating spectral purity filter may sufficiently reduce the requirements of the membrane spectral purity filter, in terms of the durability required of the membrane spectral purity filter and/or the filtering effect of particular undesirable radiation wavelengths, that the design criteria of the membrane spectral purity filter may be relaxed, providing further benefits. For example, reducing the durability requirements for the membrane spectral purity filter may enable the use of a membrane spectral purity filter that does not include a supporting grid for the thin film of material. This may increase the transparency of the membrane spectral purity filter to the desirable radiation wavelength, such as EUV radiation.

In an alternative embodiment, the lithographic apparatus may combine the use of a grating spectral purity filter with a grid spectral purity filter. As with the combination discussed above using the membrane spectral purity filter, use of the grid spectral purity filter may reduce the transmission of Sn particles into the remainder of the apparatus, in particular if the grid spectral purity filter is provided close to the point of intermediate focus 12, as discussed above.

Furthermore, the use of the two different spectral purity filters may reduce the requirements of one or both of the filters. For example, a grating spectral purity filter may reduce the power significantly in either or both infrared and DUV. Accordingly, a subsequent grid spectral purity filter may be thinner than it would need to be without the presence of the grating spectral purity filter, for example 1 µm to 3 µm, preferably 2 µm, presenting a lower angular variation of absorbance of the desired radiation. This in turn, permits greater flexibility in selection of the location of the grid spectral purity filter.

However, the grid spectral purity filter may not reduce the transmission of Sn particles into the remainder of the apparatus as effectively as a membrane spectral purity filter, as discussed above, because the grid spectral purity filter may only prevent transmission of relatively large Sn particles (for example, greater than approximately 3 to 5 µm). Furthermore, the combination of a single grating spectral purity filter and a grid spectral purity filter may not sufficiently suppress DUV radiation.

Therefore, for example, a combined grating spectral purity filter, as discussed above, may be used in combination with the grid spectral purity filter, having a first grating spectral purity filter configured to suppress infrared radiation and a second spectral purity filter provided to suppress DUV radiation. Alternatively or additionally, an anti reflection coating may be provided on one or more of the reflectors within the lithographic apparatus in order to reduce the transmission of DUV radiation.

It will be appreciated that other combinations of different spectral purity filters may also be considered. For example, a lithographic apparatus may use a combination of a grating spectral purity filter and anti reflection coatings on one or more reflectors within the lithographic apparatus. Similarly, a lithographic apparatus may use a grid spectral purity filter in combination with a membrane spectral purity filter.

Likewise, it should be appreciated that a lithographic apparatus may use three of more spectral purity filters in combination. For example, a lithographic apparatus may include a grating spectral purity filter, a grid spectral purity filter and a membrane spectral purity filter in combination. Such a combination may optionally also include the use of antireflection coatings on one or more reflectors within the lithographic apparatus.

In general, it may be desirable for the first spectral purity filter to be selected to significantly reduce the power of undesirable radiation in the beam, for example, attenuating infrared radiation. The second spectral purity filter may be selected to reduce DUV radiation.

In an arrangement, one spectral purity filter may be provided in the radiation source and another outside the source, for example in the illumination system. The radiation source may, in some apparatus, be considered to terminate at a point of intermediate focus between the source and the illumination system.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc.

Although specific reference may have been made above to the use of embodiments of the invention in the context of optical lithography, it will be appreciated that the invention may be used in other applications, for example imprint lithography, and where the context allows, is not limited to optical lithography.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

It is to be understood that in the present application, the term "including" does not exclude other elements or steps. Also, each of the terms "a" and "an" does not exclude a plurality. Any reference sign(s) in the claims shall not be construed as limiting the scope of the claims.

What is claimed is:

1. A lithographic apparatus configured to pattern a beam of radiation and project the beam of radiation onto a substrate, comprising:
    a first spectral purity filter configured to reduce the intensity of radiation in the beam of radiation in at least one first undesirable range of radiation wavelengths; and
    a second spectral purity filter configured to reduce the intensity of radiation in the beam of radiation in at least one second undesirable range of radiation wavelengths that is different than the at least one first undesirable range of radiation wavelengths;
    wherein the first spectral purity filter and the second spectral purity filter are provided with different radiation filtering structures from each other;
    wherein the first spectral purity filter is a grating spectral purity filter, comprising:
        a first multilayer stack of alternating layers, configured to reflect radiation of a first wavelength in a first direction relative to the first multilayer stack; and
        a first plurality of recesses in a top side of the first multilayer stack, the first plurality of recesses configured to form a grating arranged such that radiation of a second wavelength is reflected in a second direction relative to the first multilayer stack that is different from the first direction; and
    wherein the second spectral purity filter is a second grating spectral purity filter comprising:
        a second plurality of recesses, smaller than the first plurality of recesses, formed on the top side of the first multilayer stack between the recesses of the first plurality of recesses and in a lower surface of the recesses of the first plurality of recesses; and
        wherein the second plurality of recesses are configured such that radiation of a third wavelength is reflected in a third direction relative to the first multilayer stack that is different from the first direction.

2. The lithographic apparatus of claim 1, wherein the first spectral purity filter is configured to reduce the intensity of infrared radiation in the beam of radiation; and the first spectral purity filter is arranged within the radiation beam path closer to a source of radiation that provides the beam of radiation than the second spectral purity filter is to the source of radiation.

3. The lithographic apparatus of claim 1, wherein the lithographic apparatus further comprises a radiation system that provides the beam of radiation; and
the first spectral purity filter is formed on a reflective surface of at least part of a collector in the radiation system.

4. The lithographic apparatus of claim 1, wherein the first plurality of recesses have a depth of between approximately 1.5 µm to 3 µm.

5. The lithographic apparatus of claim 4, wherein the depth is approximately 2.65 µm.

6. The lithographic apparatus of claim 1, wherein the second plurality of recesses have a depth of between approximately 25 nm to 75 nm.

7. The lithographic apparatus of claim 6, wherein the depth is approximately 50 nm.

8. The lithographic apparatus of claim 1, wherein the second plurality of recesses have a cross-section that is one of substantially rectangular and substantially triangular.

9. The lithographic apparatus of claim 1, wherein the second spectral purity filter is a grating filter.

10. A device manufacturing method comprising:
patterning a beam of radiation and projecting the beam of radiation onto a substrate;
using a first spectral purity filter to reduce the intensity of radiation in the beam of radiation in at least one first undesirable range of radiation wavelengths; and
using a second spectral purity filter to reduce the intensity of radiation in the beam of radiation in at least one second undesirable range of radiation wavelengths that is different than the at least one first undesirable range of radiation wavelengths;
wherein the first spectral purity filter and second spectral purity filter are provided with different radiation filtering structures from each other,
wherein the first spectral purity filter is a grating spectral purity filter comprising:
a multilayer stack of alternating layers, configured to reflect radiation of a first wavelength in a first direction relative to the multilayer stack; and
a first plurality of recesses in a top side of the multilayer stack, the first plurality of recesses configured to form a grating arranged such that radiation of a second wavelength is reflected in a second direction relative to the multilayer stack that is different from the first direction; and
wherein the second spectral purity filter comprises a second plurality of recesses, smaller than the first plurality of recesses, formed on the top side of the multilayer stack between the recesses of the first plurality of recesses and in a lower surface of the recesses of the first plurality of recesses,
wherein the second plurality of recesses are configured to form at least one second grating arranged such that radiation of a third wavelength is reflected in a third direction relative to the multilayer stack that is different from the first direction.

11. A spectral purity filter, comprising:
a multilayer stack of alternating layers, configured to reflect radiation of a first wavelength in a first direction relative to the multilayer stack; and
a first plurality of recesses in a top side of the multilayer stack, the first plurality of recesses configured to form a first grating arranged such that radiation of a second wavelength is reflected in a second direction relative to the multilayer stack that is different from the first direction;
characterized by a second plurality of recesses, smaller than the first plurality of recesses, formed on the top side of the multilayer stack between the recesses of the first plurality of recesses and in a lower surface of the recesses of the first plurality of recesses, the second plurality of recesses configured to form at least one second grating arranged such that radiation of a third wavelength is reflected in a third direction relative to the multilayer stack that is different from the first direction.

12. The spectral purity filter of claim 11, wherein the first plurality of recesses have a depth of between approximately 1.5 µm to 3 µm.

13. The spectral purity filter of claim 12, wherein the depth is approximately 2.65 µm.

14. The spectral purity filter of claim 11, wherein the second plurality of recesses have a depth of between approximately 25 nm to 75 nm.

15. The spectral purity filter of claim 14, wherein the depth is approximately 50 nm.

16. The spectral purity filter of claim 11, wherein the second plurality of recesses have a cross-section that is one of substantially rectangular and substantially triangular.

17. The spectral purity filter of claim 11, wherein the second and third directions are substantially the same.

* * * * *